US012631893B2

(12) United States Patent
Lee et al.

(10) Patent No.: US 12,631,893 B2
(45) Date of Patent: May 19, 2026

(54) COIL MEMBER AND CAMERA MODULE COMPRISING SAME

(71) Applicant: LG INNOTEK CO., LTD., Seoul (KR)

(72) Inventors: Sang Kyu Lee, Seoul (KR); Jung Hun Oh, Seoul (KR); Chae Hwan Yim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 559 days.

(21) Appl. No.: 18/037,625

(22) PCT Filed: Nov. 17, 2021

(86) PCT No.: PCT/KR2021/016931
§ 371 (c)(1),
(2) Date: May 18, 2023

(87) PCT Pub. No.: WO2022/131586
PCT Pub. Date: Jun. 23, 2022

(65) Prior Publication Data
US 2023/0408839 A1     Dec. 21, 2023

(30) Foreign Application Priority Data

Dec. 17, 2020    (KR) ........................ 10-2020-0177710

(51) Int. Cl.
*G03B 5/00*        (2021.01)
*G02B 27/64*       (2006.01)
(Continued)

(52) U.S. Cl.
CPC ............ *G02B 27/646* (2013.01); *G03B 5/00* (2013.01); *H01F 17/0006* (2013.01);
(Continued)

(58) Field of Classification Search
CPC .............. G03B 5/00; G03B 2205/0007; G03B 2205/0069; G02B 27/646; H01F 17/0006;
(Continued)

(56) References Cited

U.S. PATENT DOCUMENTS 7,482,250 B2    1/2009  Wu et al.
9,720,204 B2    8/2017  Yoo et al.
(Continued)

FOREIGN PATENT DOCUMENTS

CN        108109808 A  *  6/2018  ........... H01F 27/255
CN        111308639      6/2020
(Continued)

OTHER PUBLICATIONS

International Search Report dated Mar. 4, 2022 issued in Application No. PCT/KR2021/016931.
(Continued)

*Primary Examiner* — Christopher E Mahoney
(74) *Attorney, Agent, or Firm* — KED & ASSOCIATES

(57) ABSTRACT
A coil member, according to an embodiment, comprises: a substrate comprising a first surface and a second surface that is opposite to the first surface; a wiring pattern disposed on the substrate; and a metal coating pattern which is connected to the wiring pattern, the metal coating pattern being thinner than the wiring pattern.

20 Claims, 9 Drawing Sheets

(51) Int. Cl.
   H01F 17/00 (2006.01)
   H01L 21/78 (2006.01)
(52) U.S. Cl.
   CPC ................ *G03B 2205/0007* (2013.01); *G03B 2205/0069* (2013.01); *H01L 21/78* (2013.01)
(58) Field of Classification Search
   CPC ........ H01F 5/003; H04N 23/54; H04N 23/57; H02K 3/44; H01L 21/78
   See application file for complete search history.

(56)                References Cited

U.S. PATENT DOCUMENTS

| | | |
|---|---|---|
| 2006/0134888 A1 | 6/2006 | Wu et al. |
| 2015/0153539 A1 | 6/2015 | Yoo et al. |
| 2016/0351320 A1 | 12/2016 | Jeong |
| 2024/0006945 A1 * | 1/2024 | Lee .......................... G03B 5/02 |

FOREIGN PATENT DOCUMENTS

| | | | | |
|---|---|---|---|---|
| JP | 10261537 A * | 9/1998 | ............. | H01L 21/78 |
| JP | 2002-076578 | 3/2002 | | |
| JP | 2010-074118 | 4/2010 | | |
| JP | 2013-175659 | 9/2013 | | |
| KR | 10-2015-0064997 | 6/2015 | | |
| KR | 10-2015-0101676 | 9/2015 | | |
| KR | 10-2016-0139967 | 12/2016 | | |
| KR | 10-2017-0097883 | 8/2017 | | |
| KR | 20190013683 A * | 2/2019 | ............. | H01F 5/003 |
| TW | 200623983 | 7/2006 | | |
| WO | WO-2015079773 A1 * | 6/2015 | ............... | H01F 7/20 |

OTHER PUBLICATIONS

Taiwanese Office Action dated Aug. 10, 2022 issued in Application No. 11120792840.

Korean Office Action dated Feb. 19, 2025 issued in Application No. 10-2020-0177710.

* cited by examiner

【FIG. 1】
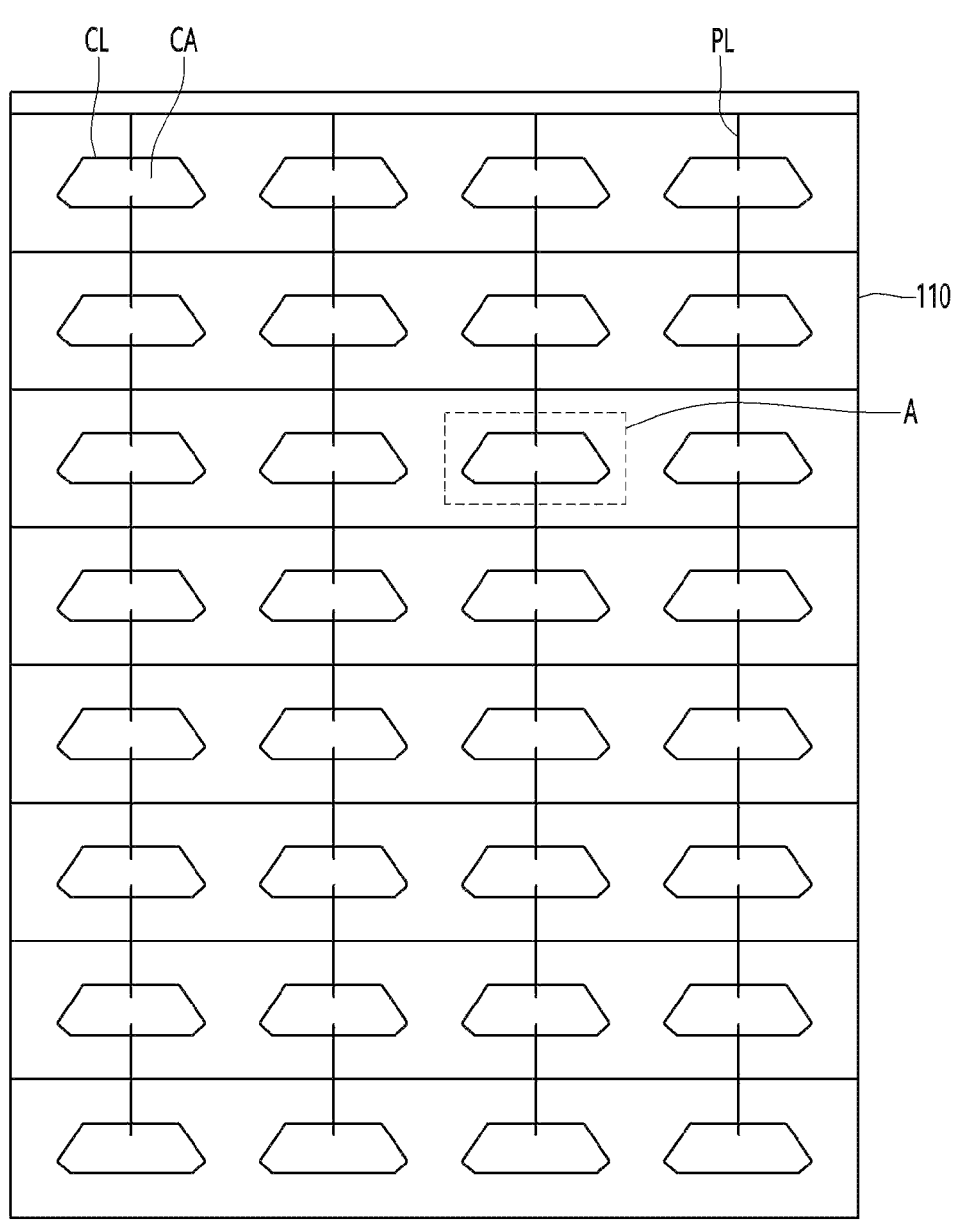

【FIG. 2】
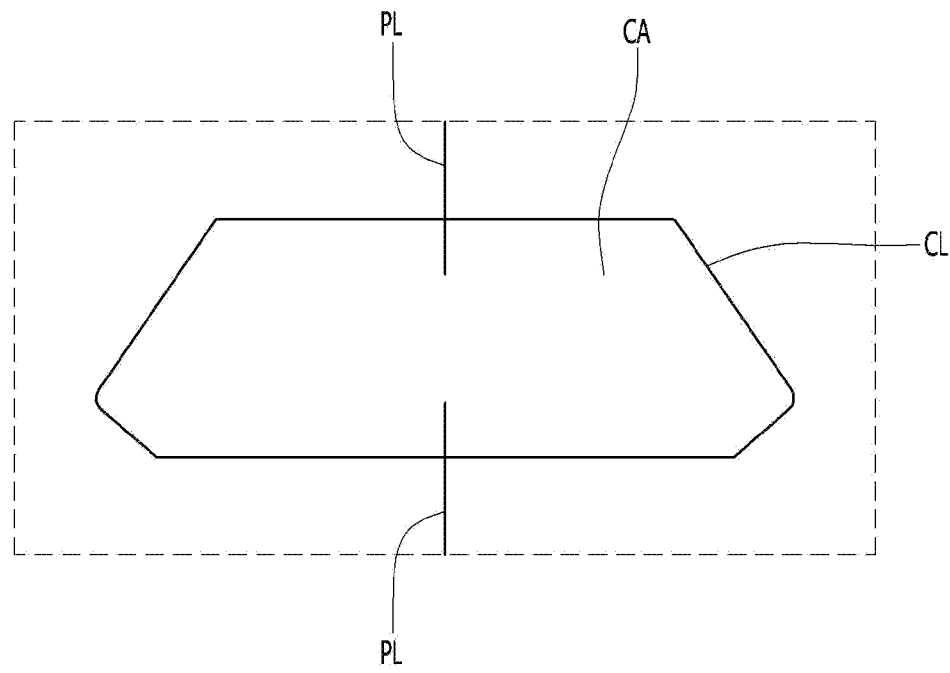
【FIG. 3】
1000
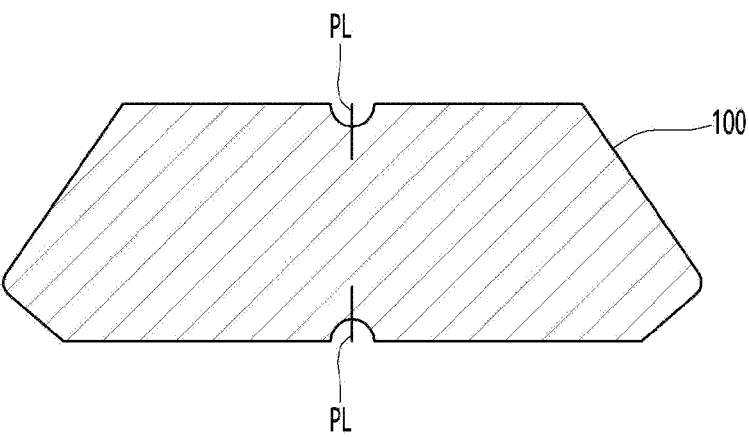

【FIG. 4】
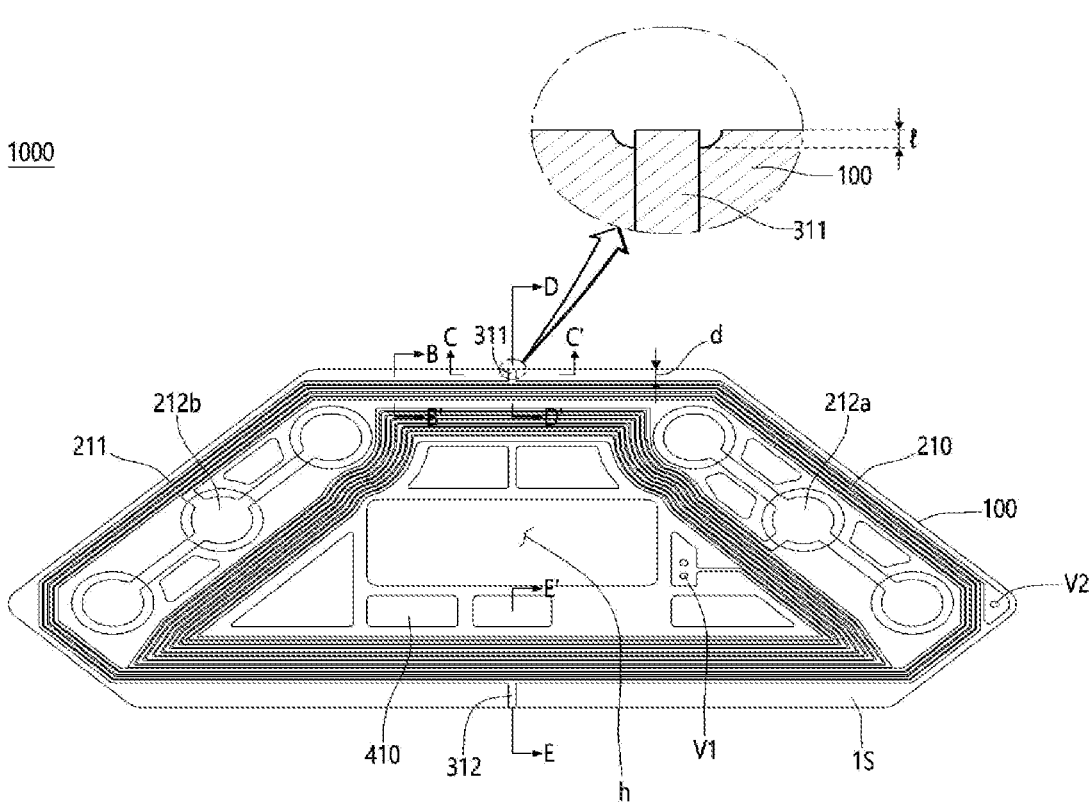

【FIG. 5】
1000
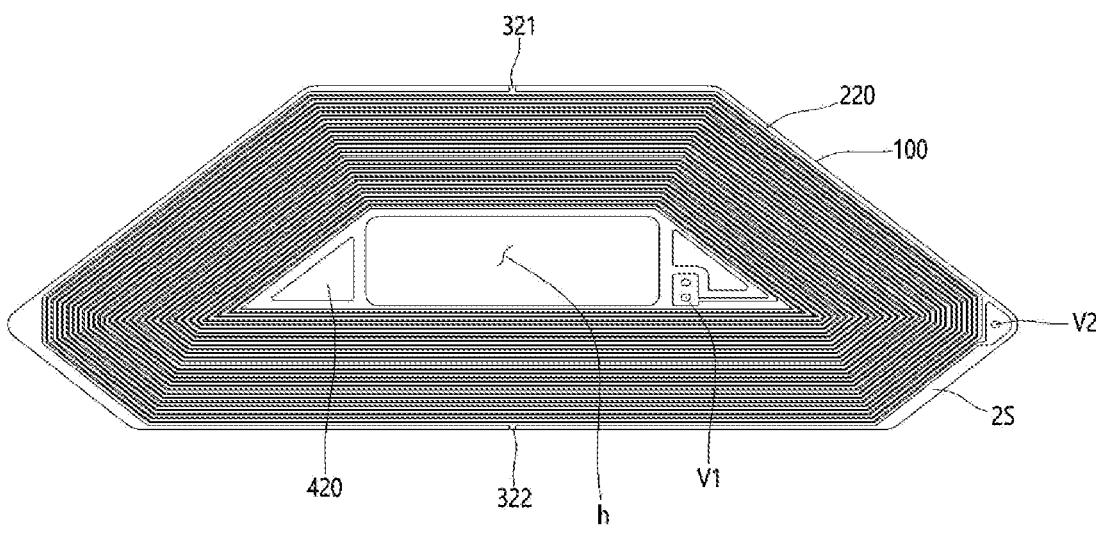
【FIG. 6】
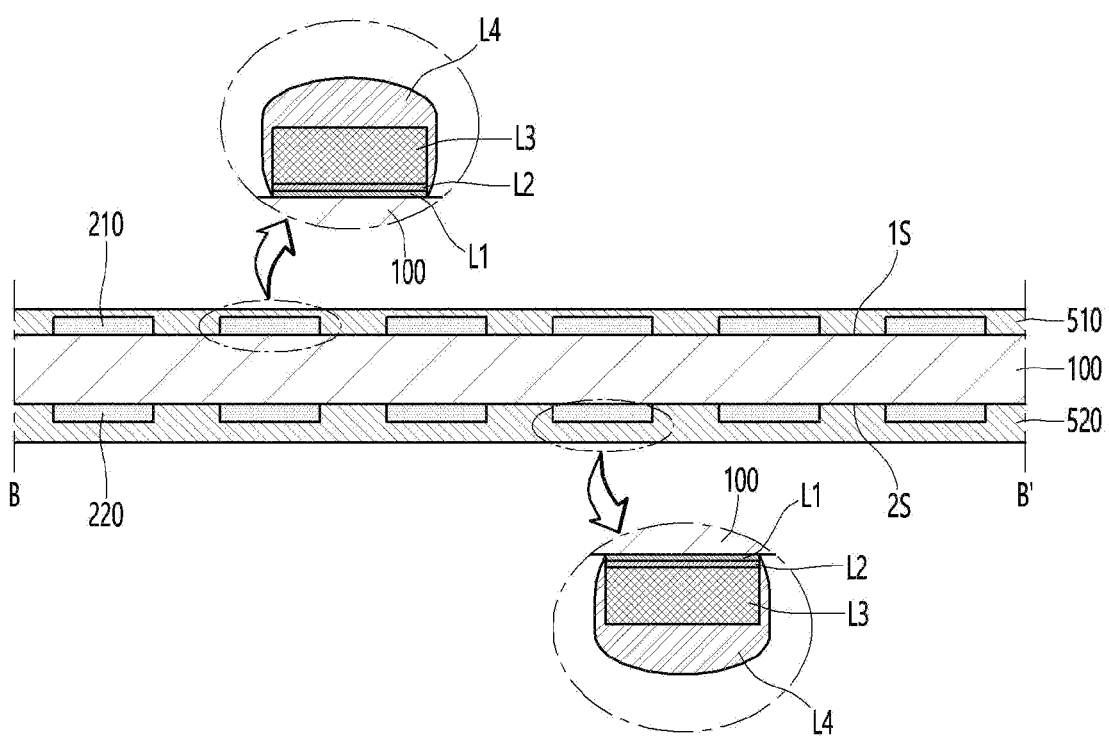

【FIG. 7】
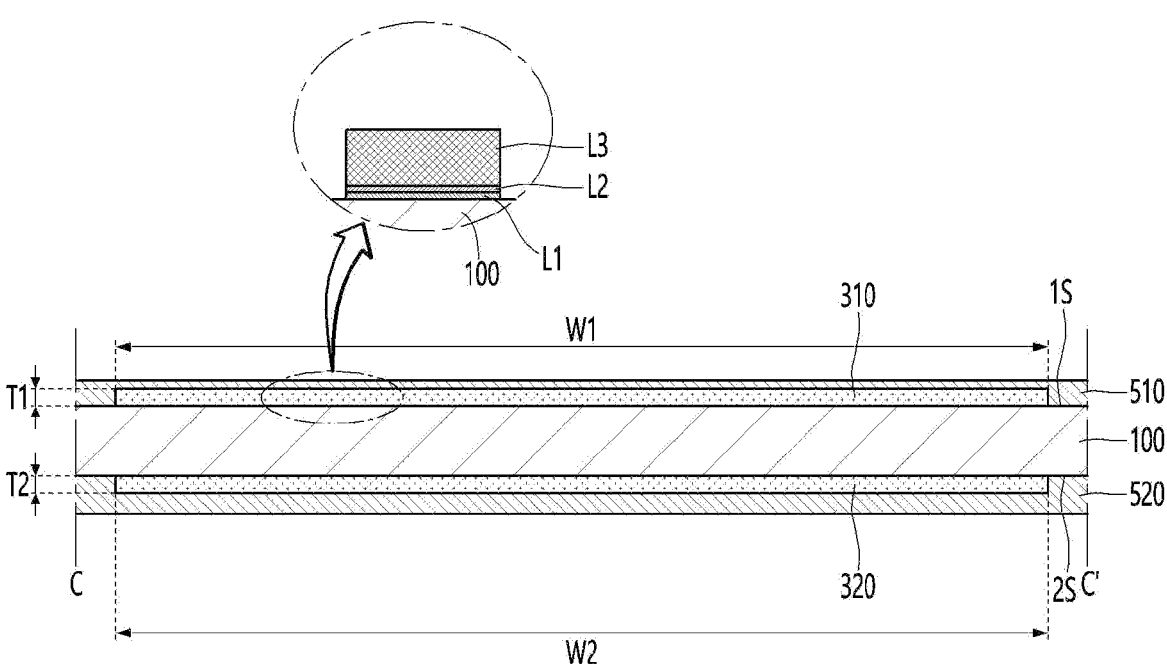
【FIG. 8】
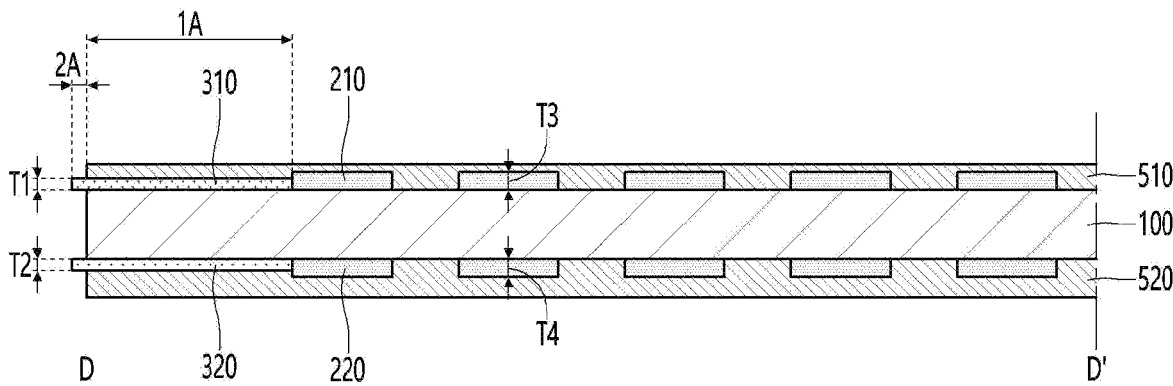

【FIG. 9】
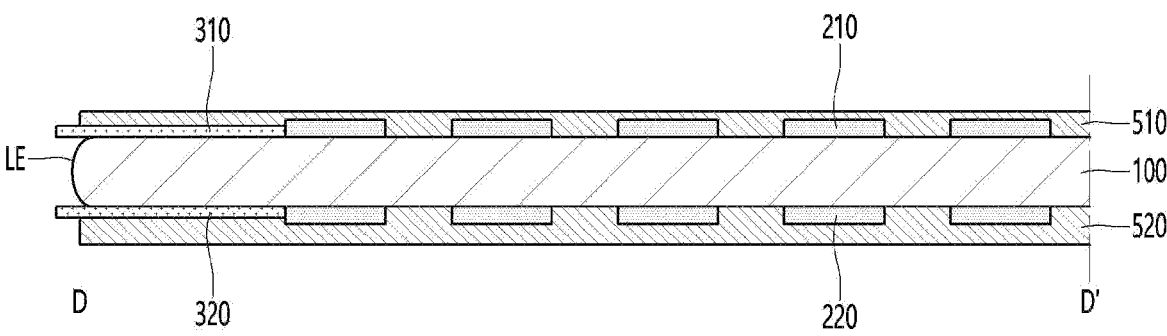
【FIG. 10】
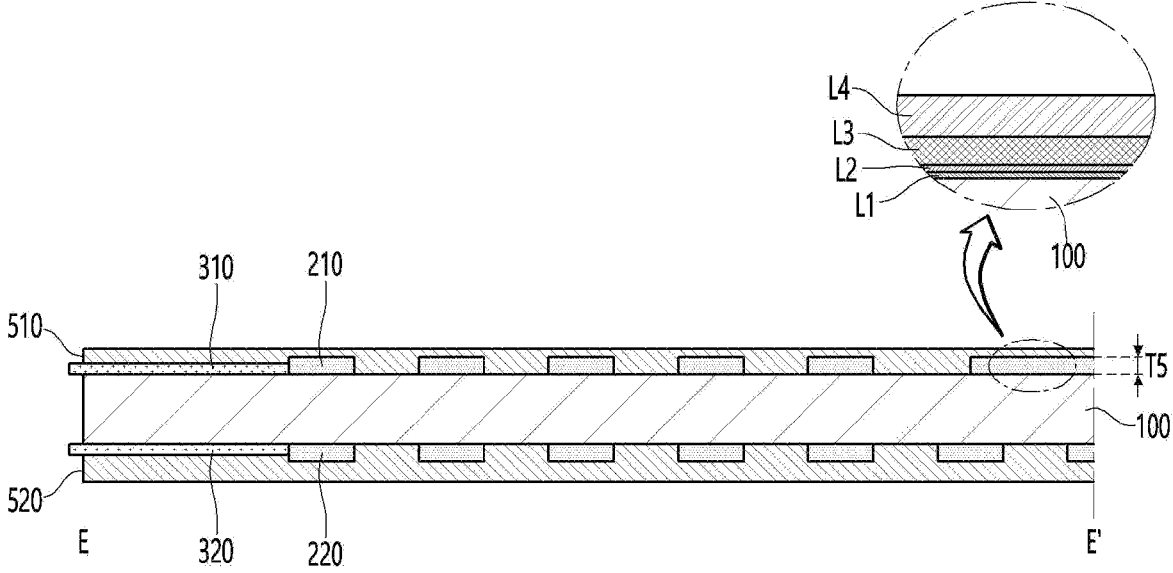

【FIG. 11】
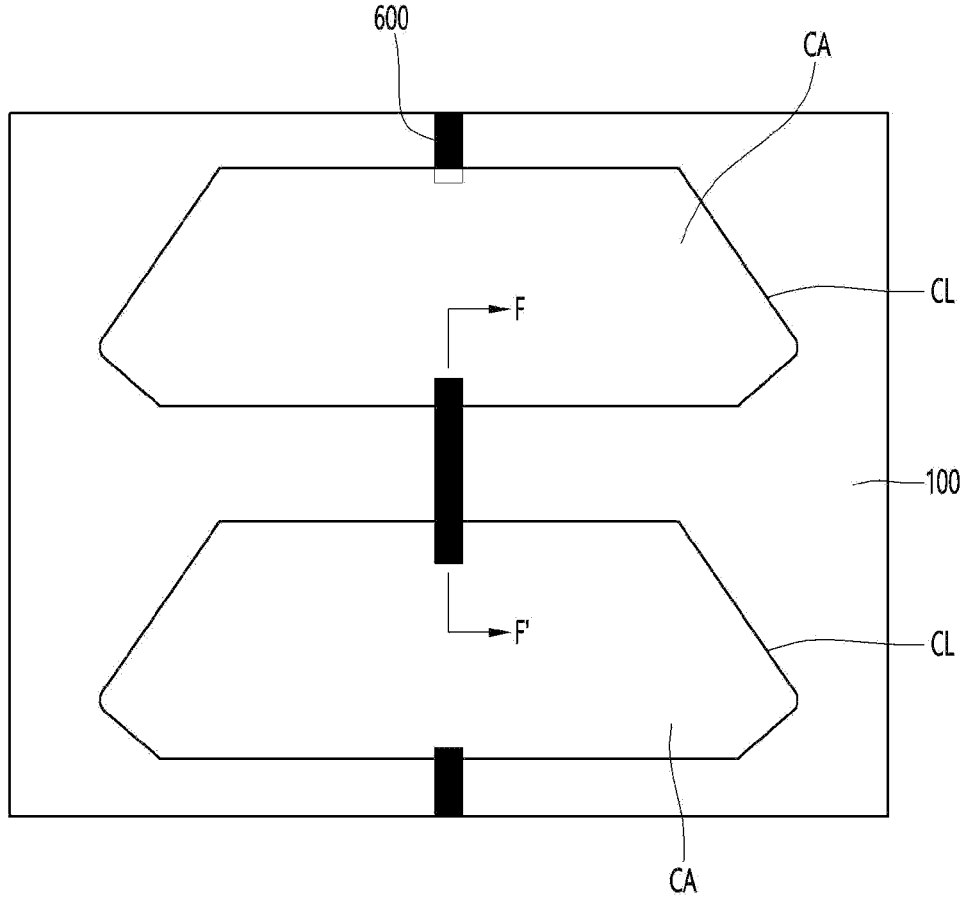
【FIG. 12】
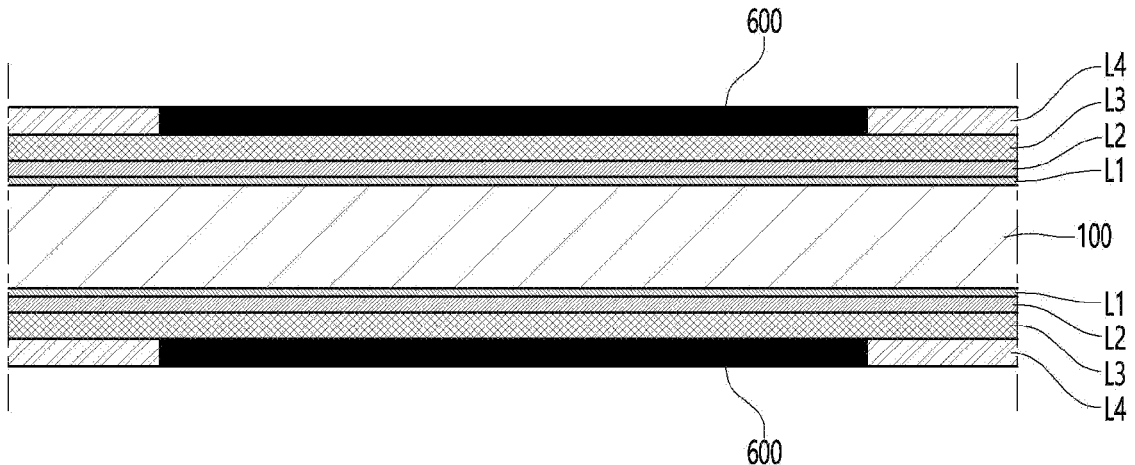

【FIG. 13】
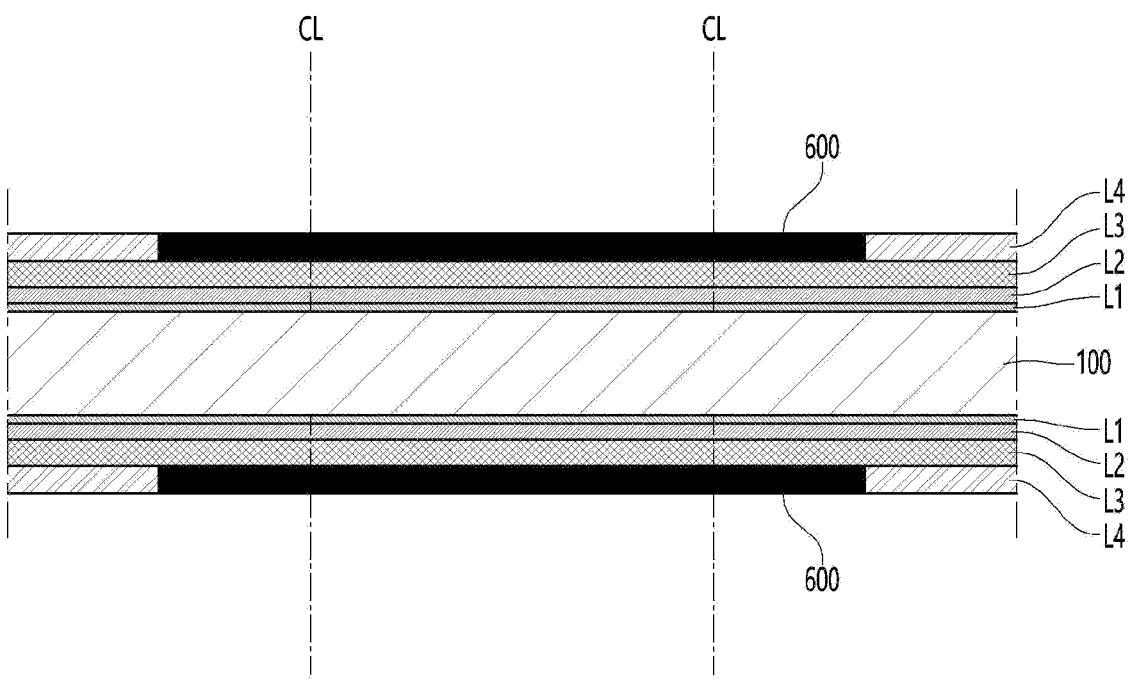

【FIG. 14】
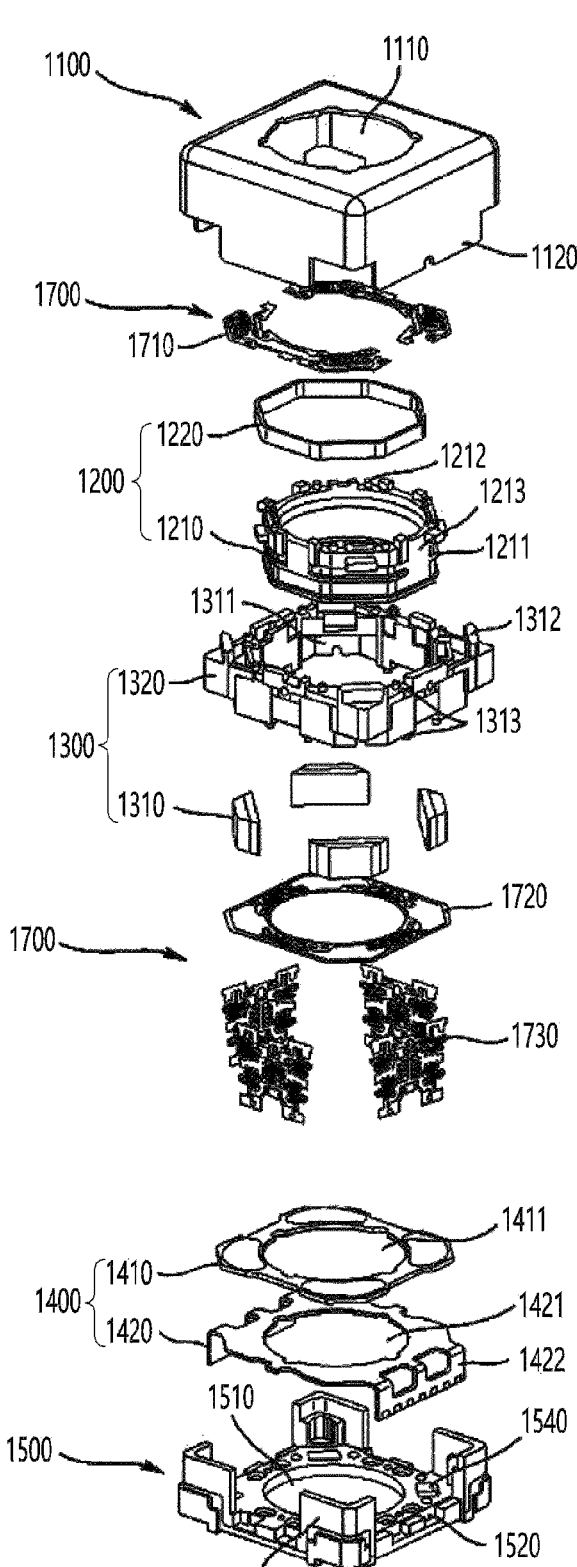

1

COIL MEMBER AND CAMERA MODULE COMPRISING SAME

CROSS-REFERENCE TO RELATED PATENT APPLICATIONS

This application is a U.S. National Stage Application under 35 U.S.C. § 371 of PCT Application No. PCT/KR2021/016931, filed Nov. 17, 2021, which claims priority to Korean Patent Application No. 10-2020-0177710, filed Dec. 17, 2020, whose entire disclosures are hereby incorporated by reference.

TECHNICAL FIELD

Embodiments relate to a coil member and a camera module including the same.

BACKGROUND ART

As various portable terminals are widely used and the wireless Internet service is commercialized, needs of consumers related to the portable terminals are diversified, and accordingly, various kinds of additional devices are installed in the portable terminals.

A representative one of them is a camera module that may photograph a subject in a photograph or a moving image, store the image data, and then edit and transmit the image data as needed.

In recent years, there has been an increasing demand for small camera modules for use in various multimedia fields such as note type personal computers, camera phones, PDAs, smart devices, toys, etc., and for image input devices such as surveillance cameras and information terminals of video tape recorders.

Conventional camera modules are roughly classified into fixed focus (F.F) type, auto focus (A.F) type, and optical image stabilization (OIS) type camera modules.

Meanwhile, in the case of the OIS type, a coil member disposed on a circuit board may be included as a component for realizing a camera shake prevention function.

Such a coil member may be formed by disposing a coil-shaped electrode on a substrate.

Meanwhile, the coil member may be formed by forming a plurality of coil members on a large-area substrate and cutting each coil member using a laser. In this case, since a plating process is required when forming electrodes of each coil member, plating lines may be connected to each coil member. Accordingly, after the coil member is cut, cut plating lines may remain on each coil member.

In this case, since the substrate and the plating line of the coil member have different laser absorption rates, the plating line may protrude to the outside of the substrate as the substrate around the plating line is removed together in a region where the plating line is cut.

Accordingly, since a protective layer is not disposed on the plating line protruding to the outside, there is a problem that the reliability of the coil member is deteriorated due to corrosion of the plating line.

Therefore, there is a need for a coil member capable of solving the above problems and a camera module including the same.

2

DISCLOSURE

Technical Problem

An embodiment is directed to providing a coil member having improved reliability and a camera module including the same.

Technical Solution

A coil member according to an embodiment includes: a substrate including a first surface and a second surface opposite to the first surface; a wiring pattern disposed on the substrate; and a plating pattern connected to the wiring pattern, wherein a thickness of the plating pattern is smaller than a thickness of the wiring pattern.

Advantageous Effects

A coil member according to an embodiment may reduce a protrusion length of a plating pattern protruding from an end of a substrate by forming the plating pattern so as to have a relatively small thickness.

In detail, when cutting with a laser along a cutting line of the coil member region, an intensity or irradiation time of the laser may be greater than that of other regions in order to remove the plating pattern in a region where the plating pattern is disposed on the substrate.

Accordingly, while the plating pattern is removed, the substrate in a peripheral region where the plating pattern is disposed may be removed together. In this case, the degree to which the substrate is removed may increase in proportion to the intensity and irradiation time of the laser. Accordingly, as the thickness of the plating pattern increases, the intensity and irradiation time of the laser increase, thereby increasing an area from which the substrate is removed in the region where the plating pattern is disposed. That is, the degree to which the substrate is removed during the process of cutting the plating pattern may be proportional to the thickness of the plating pattern.

Accordingly, when the coil member is cut, the substrate in the peripheral region on which the plating pattern is disposed is removed together. After the coil member is cut, the plating pattern may be disposed to protrude from the end of the substrate. Accordingly, poor appearance and reliability of the coil member may occur due to corrosion of the protruding plating pattern, whereby defects may occur when the coil member is coupled to the printed circuit board.

Therefore, the coil member according to the embodiment may reduce the thickness of the plating pattern. Accordingly, the intensity and irradiation time of the laser is reduced when cutting the coil member, thereby solving the above problems.

That is, in the coil member according to the embodiment, the thickness of the plating pattern may be formed smaller than that of other patterns. Accordingly, when the coil member is cut, it is possible to minimize removal of the substrate in a peripheral region of the plating pattern. Accordingly, it is possible to minimize the length in which the plating pattern of the coil member protrudes from the end of the substrate after cutting the coil member.

DESCRIPTION OF DRAWINGS

FIG. 1 is a view for describing a cutting process of a coil member according to an embodiment.

FIG. 2 is an enlarged view of region A in FIG. 1.

FIG. 3 is a view for describing exposure of a plating line of the coil member according to the embodiment FIG. 4 is a view showing a bottom view of the coil member according to the embodiment.

FIG. 5 is a view showing a top view of the coil member according to the embodiment.

FIG. 6 is a view showing a cross-sectional view taken along line B-B' of FIG. 4.

FIG. 7 is a view showing a cross-sectional view taken along line C-C' of FIG. 4.

FIGS. 8 and 9 are views showing a cross-sectional view taken along line D-D' of FIG. 4.

FIG. 10 is a view showing a cross-sectional view taken along line E-E' of FIG. 4.

FIGS. 11 to 13 are views for describing a masking process and a cutting process of a plating line formed in a manufacturing process of the coil member according to the embodiment.

FIG. 14 is a view showing a perspective view of a camera module including the coil member according to the embodiment.

MODES OF THE INVENTION

Hereinafter, embodiments of the present disclosure will be described in detail with reference to the accompanying drawings. However, the spirit and scope of the present disclosure is not limited to a part of the embodiments described, and may be implemented in various other forms, and within the spirit and scope of the present disclosure, one or more of the elements of the embodiments may be selectively combined and replaced.

In addition, unless expressly otherwise defined and described, the terms used in the embodiments of the present disclosure (including technical and scientific terms) may be construed the same meaning as commonly understood by one of ordinary skill in the art to which the present disclosure belongs, and the terms such as those defined in commonly used dictionaries may be interpreted as having a meaning that is consistent with their meaning in the context of the relevant art.

In addition, the terms used in the embodiments of the present disclosure are for describing the embodiments and are not intended to limit the present disclosure. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present disclosure, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a coil member according to an embodiment will be described with reference to the drawings.

FIGS. 1 to 3 are views for describing a manufacturing process of the coil member according to the embodiment.

Referring to FIGS. 1 and 2, a plurality of coil member regions CA may be formed on the substrate 110, and a circuit pattern (not shown) forming the coil member may be disposed inside each of the coil member regions.

In this case, the circuit pattern disposed inside the coil member region CA may be formed through a plating process. Accordingly, plating lines PL for forming a plating layer may be connected to each of the coil member regions CA in order to dispose the circuit pattern in the coil member region CA.

Accordingly, the circuit pattern formed of the plating layer may be formed inside the coil member region CA by a current transmitted through the plating line PL.

The plating line PL may include two plating lines PL of a cathode and an anode, and the two plating lines PL may be connected to one coil member region CA. That is, each of the coil member regions CA may be connected to two plating lines transmitting current to one surface of the substrate 110 and two plating lines transmitting current to the other surface of the substrate 110.

Alternatively, one plating line transmitting current to one surface of the substrate 110 may be connected to each of the coil member regions CA, and one plating line transmitting current to the other surface of the substrate 110 may be connected to each of the coil member regions CA. In other words, at least two or more plating lines may be connected to one surface or the other surface of the substrate in the coil member region.

Subsequently, the substrate 110 may be cut. In detail, the substrate 110 may be cut along a cutting line CL of a plurality of coil member regions CA disposed on the substrate 110. In detail, each unit coil member may be separated from the substrate 110 by irradiating a laser along the cutting line CL of the plurality of coil member regions.

The cutting line CL may include both a region where only the substrate 110 is disposed and a region where the plating line PL is disposed on the substrate 110. In this case, the substrate 110 and the plating line PL may have different laser absorption rates. In detail, the laser absorption rate of the plating line PL may be smaller than the laser absorption rate of the substrate 110. That is, the laser absorption rate of the plating line PL including a metal may be smaller than the laser absorption rate of the substrate 110 including a plastic.

Accordingly, when cutting along the cutting line CL, an intensity of the laser in the region where the plating line is disposed may be greater than that of the region where only the substrate 110 is disposed, or an irradiation time of the laser in the region where the plating line is disposed may be longer than that of the region where only the substrate 110 is disposed.

Therefore, the substrate 110 may also be removed while the plating line is cut in a peripheral region where the plating line is disposed during a process of removing the plating line PL. Accordingly, as shown in FIG. 3, the plating line PL may protrude from an end of the substrate 100 in a finally cut coil member to be exposed to the outside.

Since a separate protective layer is not disposed on such a protruding plating line PL, corrosion may occur in the coil member 1000 through the protruding plating line PL, and since such corrosion may progress and extend to the circuit pattern of the coil member, the reliability of the coil member may be deteriorated.

Accordingly, the coil member according to the embodiment to be described below is directed to providing a coil member capable of minimizing a size of the protrusion of the plating line generated during the cutting process of the coil member as described above.

FIG. 4 is a view showing a bottom view of the coil member according to the embodiment, and FIG. 5 is a view showing a top view of the coil member according to the embodiment.

Referring to FIGS. 4 and 5, the coil member 1000 may include the substrate 100, a plurality of circuit patterns, and a protective layer.

The substrate 100 may be formed by cutting the above-described substrate 110 into a unit coil member 1000.

The substrate 100 may be a flexible substrate. That is, the substrate 100 may include a flexible plastic. For example, the substrate 100 may be a polyimide (PI) substrate. However, the embodiment is not limited thereto, and the substrate 100 may be a substrate made of a polymer material such as polyethylene terephthalate (PET) or polyethylene naphthalate (PEN).

The substrate 100 may be an insulating substrate. That is, the substrate 100 may be the insulating substrate supporting various circuit patterns.

The substrate 100 may have a thickness of 20 μm to 100 μm. For example, the substrate 100 may have a thickness of 25 μm to 75 μm. For example, the substrate 100 may have a thickness of 30 μm to 40 μm. When the thickness of the substrate 100 exceeds 100 μm, the overall thickness of the coil member may increase. In addition, when the thickness of the substrate 100 is less than 20 μm, the substrate 100 may be vulnerable to heat, pressure, or the like in a process of forming a coil electrode of the substrate 100.

A hole h may be formed on the substrate 100. In detail, the hole h passing through the substrate 100 may be formed in a central region of the substrate 100. When the coil member 1000 is applied to a camera module, the hole h may serve as a driving of the camera module, for example, a sensing hole, or the like.

The circuit pattern may be disposed on the substrate 100. In detail, the circuit pattern may be disposed on both surfaces of the substrate 100. That is, the circuit pattern may be disposed on a first surface 1S of the substrate 100 and a second surface 2S opposite to the first surface 1S. Alternatively, the circuit pattern may be disposed on the first surface 1S of the substrate 100 or on the second surface 2S opposite to the first surface 1S. That is, the circuit pattern may be disposed on at least one of the first surface 1S of the substrate 100 and the second surface 2S opposite to the first surface 1S.

The circuit pattern may include a plurality of types of patterns. In detail, the circuit pattern may include a plurality of types of patterns according to roles, positions, and connection relationships of the patterns. In detail, the circuit pattern may include a wiring pattern, a plating pattern, and a dummy pattern.

Wiring patterns 210 and 220 may include a first wiring pattern 210 and a second wiring pattern 220. In detail, the wiring patterns 210 and 220 may include the first wiring pattern 210 disposed on the first surface 1S of the substrate 100 and the second wiring pattern 220 disposed on the second surface 2S of the substrate 100.

Here, the first surface 1S of the substrate 100 may be defined as a surface facing a printed circuit board of the camera module on which the coil member 1000 is disposed, and the second surface 2S of the substrate 100 may be defined as a surface opposite to the first surface 1S.

The first wiring pattern 210 may be disposed on a lower surface of the coil member 1000. The first wiring pattern 210 may be disposed in a closed loop coil shape on the first surface 1S of the substrate 100. That is, the first wiring pattern 210 may be a first coil pattern disposed on the first surface 1S of the substrate 100.

The first wiring pattern 210 may include a wiring portion 211 and pad portions 212*a* and 212*b*. The first wiring pattern 210 may be electrically connected to the printed circuit board disposed under the coil member 1000 through the pad portions 212*a* and 212*b*.

The second wiring pattern 220 may be disposed on an upper surface of the coil member 1000. The second wiring pattern 220 may be disposed in the closed loop coil shape on the second surface 2S of the substrate 100. That is, the second wiring pattern 220 may be a second coil pattern disposed on the second surface 2S of the substrate 100.

The first wiring pattern 210 and the second wiring pattern 220 may be connected to each other. In detail, the first wiring pattern 210 and the second wiring pattern 220 may be connected to each other through via holes formed in the substrate 100.

In detail, the first wiring pattern 210 may include a first-first connection region and a first-second connection region. A first via hole V1 may be formed in the first-first connection region, and a second via hole V2 may be formed in the first-second connection region.

In addition, the second wiring pattern 220 may include a second-first connection region and a second-second connection region. The first via hole V1 may be formed in the second-first connection region, and the second via hole V2 may be formed in the second-second connection region.

The first via hole V1 or the second via hole V2 may be formed of one or two or more, respectively. When the first via hole V1 or the second via hole V2 is formed in plural, even though a connection failure occurs in any one of the via holes during the process, it is possible to connect in the other via holes, thereby minimizing a characteristic failure of the coil member.

In addition, in order to form the plurality of via holes, the wiring pattern of the connection region may be formed wider than the wiring pattern forming a closed roof. Accordingly, when the first wiring pattern and the second wiring pattern are connected through the connection region, it is possible to prevent an alignment failure in which the first wiring pattern, the connection region, and the second wiring pattern are not connected.

The first wiring pattern 210 may include a first pad portion 212*a* and a second pad portion 212*b*. When a signal is transmitted from the first pad portion 212*a* on the first surface 1S of the substrate 100 connected to the printed circuit board, the signal may be transmitted to the first-first connection region in a coil shape from the outside to the inside along the first wiring pattern 210 and may be transmitted from the first-first connection region to the second-first connection region of the second surface 2S through the first via hole V1.

Subsequently, the signal may be transmitted to the second-second connection region in the coil shape from the inside to the outside along the second wiring pattern 220 and may be transmitted to the first-second connection region of the first surface 1S through the second via hole V2. Then, the signal may be transmitted to the second pad portion 212*b* along the first wiring pattern 220, and the signal may be transmitted to the printed circuit board again.

The first pad portion 212a or the second pad portion 212b may be formed of one or two or more pad portions, respectively. In other words, the first pad portion 212a or the second pad portion 212b may be formed in plurality. Accordingly, it is possible to prevent a contact failure that may occur when the pad portion and the printed circuit board are connected.

The plating pattern may be the plating line PL remaining on the substrate 100 after cutting the plating line PL described above with reference to FIGS. 1 to 3.

The plating pattern may include a first plating pattern and a second plating pattern. The plating pattern may include the first plating pattern disposed on the first surface 1S of the substrate 100 and including a first-first plating pattern 311 and a first-second plating pattern 312 and the second plating pattern disposed on the second surface 2S of the substrate 100 and including a second-first plating pattern 321 and a second-second plating pattern 322.

Alternatively, the plating pattern may include the first plating pattern disposed on the first surface 1S of the substrate 100 and including at least one of the first-first plating pattern 311 and the first-second plating pattern 312 or the second plating pattern disposed on the second surface 2S of the substrate 100 and including at least one of the second-first plating pattern 321 and the second-second plating pattern 322. That is, the plating pattern may include at least one of the first plating pattern and the second plating pattern.

The first-first plating pattern 311 and the first-second plating pattern 312 may be connected to the first wiring pattern 210. In detail, the first-first plating pattern 311 and the first-second plating pattern 312 may be connected to the first wiring pattern 210 disposed at the outermost portion among the first wiring patterns 210. Accordingly, the first wiring pattern 210 may include a plating layer formed through an electrolytic plating process using a current transmitted through the first-first plating pattern 311 and the first-second plating pattern 312.

In addition, the second-first plating pattern 321 and the second-second plating pattern 322 may be connected to the second wiring pattern 220. In detail, the second-first plating pattern 321 and the second-second plating pattern 322 may be connected to the second wiring pattern 220 disposed at the outermost portion among the second wiring patterns 220. Accordingly, the second wiring pattern 220 may include a plating layer formed through an electrolytic plating process using a current transmitted through the second-first plating pattern 321 and the second-second plating pattern 322.

The first plating pattern may be disposed to extend to the end of the substrate 100. Alternatively, the first plating pattern may be disposed to extend so as to further protrude from the end of the substrate 100.

In addition, the second plating pattern may be disposed to extend to the end of the substrate 100. Alternatively, the second plating pattern may be disposed to extend so as to further protrude from the end of the substrate 100.

For example, the plating pattern may be disposed to protrude from the end of the substrate 100. In this case, a protrusion length 1 of the plating pattern may be 30 μm or less.

In detail, the protrusion length 1 of the plating pattern may be smaller than a first distance d defined as a maximum distance between the substrate 100 and the first wiring pattern disposed at the outermost portion among the first wiring patterns.

Alternatively, the protruding length 1 of the plating pattern may be greater than widths of the wiring patterns 210 and 220. Alternatively, the protrusion length 1 of the plating pattern may be greater than intervals of the wiring patterns 210 and 220.

When the protrusion length 1 of the plating pattern exceeds 30 μm or exceeds the first distance d, the degree of freedom in design of the camera module decreases due to a size of the coil member increases, and accordingly, a size of the camera module may also increase.

The coil member according to the embodiment may reduce the protrusion length of the plating pattern protruding from the end of the substrate 100. Accordingly, a length of the plating pattern exposed to the outside in the coil member may be reduced. That is, the coil member may reduce the length of the plating pattern exposed to the outside without the protective layer.

Accordingly, it is possible to prevent the plating pattern from being corroded by the exposed plating pattern, and to prevent the reliability of the coil member extending to the circuit pattern from being deteriorated due to the corrosion.

The coil member according to the embodiment may make a layer structure of the plating pattern thinner than other patterns in order to reduce the protrusion length of the plating pattern.

For example, the first plating pattern and the second plating pattern may be formed in a layer structure different from that of the first wiring pattern 210 and the second wiring pattern 220. In addition, the first plating pattern and the second plating pattern may be formed to have a height different from that of the first wiring pattern 210 and the second wiring pattern 220. In addition, the first plating pattern and the second plating pattern may be formed to have a width different from that of the first wiring pattern 210 and the second wiring pattern 220.

Layer structures, heights, and widths of the first and second plating patterns and the first and second wiring patterns 210 and 220 will be described in detail below.

Dummy patterns 410 and 420 may include a first dummy pattern 410 and a second dummy pattern 420. In detail, the dummy patterns 410 and 420 may include the first dummy pattern 410 disposed on the first surface 1S of the substrate 100 and the second dummy pattern 420 disposed on the second surface 2S of the substrate 100.

The first dummy pattern 410 and the second dummy pattern 420 may be respectively disposed on the wiring patterns 210 and 220 and a region where the plating pattern is not disposed on the first surface 1S and the second surface 2S of the substrate 100. That is, the first dummy pattern 410 and the second dummy pattern 420 may be disposed to be spaced apart from the wiring patterns 210 and 220 and the plating pattern.

In addition, the first dummy pattern 410 and the second dummy pattern 420 may be disposed to be disconnected without being connected to other patterns. That is, a signal may not be transmitted to the first dummy pattern 410 and the second dummy pattern 420. That is, no signal is transmitted to the first dummy pattern 410 and the second dummy pattern 420, and the first dummy pattern 410 and the second dummy pattern 420 may be disposed on both sides or one side of the substrate 100 to adjust the degree of plating for each position of the circuit pattern, which is caused by a region with and without the wiring pattern, so that it is possible to secure the width or thickness uniformity of the circuit pattern, and to serve as an alignment mark when forming the wiring patterns.

Meanwhile, the first plating pattern and the second plating pattern may be formed in a layer structure different from that of the first dummy pattern 410 and the second dummy pattern 420. In addition, the first plating pattern and the second plating pattern may be formed to have a height different from that of the first dummy pattern 410 and the second dummy pattern 420. In addition, the first plating pattern and the second plating pattern may be formed to have a width different from that of the first dummy pattern 410 and the second dummy pattern 420.

Layer structures, heights, and widths of the first and second plating patterns and the first and second dummy patterns 410 and 420 will be described in detail below.

FIG. 6 is a view showing a cross-sectional view taken along line B-B' of FIG. 4. That is, FIG. 6 is a view showing a cross-sectional view of the wiring pattern of the coil member according to the embodiment.

Referring to FIG. 6, the first wiring pattern 210 and the second wiring pattern 220 may be disposed on the substrate 100. In detail, the first wiring pattern 210 disposed on the first surface 1S of the substrate 100 and the second wiring pattern 220 disposed on the second surface 2S of the substrate 100 may be disposed on the substrate 100.

The wiring patterns 210 and 220 may include a plurality of layers. In detail, the wiring patterns 210 and 220 may include a plurality of conductive layers. For example, the wiring patterns 210 and 220 may include a first layer L1, a second layer L2, a third layer L3, and a fourth layer L4 that are disposed to be sequentially stacked on the substrate 100.

The first layer L1 may be disposed on the substrate 100. In detail, the first layer L1 may be disposed in direct contact with the substrate 100.

The first layer L1 may be formed in multiple layers. For example, the first layer L1 may include at least one of nickel, chromium, and titanium. That is, the first layer L1 may include at least one of a nickel layer, a chromium layer, and a titanium layer. For example, the first layer L1 may include the nickel layer and the chromium layer on the nickel layer.

The first layer L1 may be formed through an electroless plating or sputtering process. The first layer L1 may be disposed to have a thin thickness of a thin film. In detail, the first layer L1 may be disposed to have a thickness of 20 nm or less.

The first layer L1 may be a layer that improves adhesion between the second layer L2 disposed on the first layer L1 and the substrate 100. For example, the nickel layer may have good adhesion to the substrate 100, and the chromium layer may have good adhesion to the nickel layer and the second layer L2. Accordingly, the adhesion of the second layer L2 disposed on the substrate 100 may be improved.

The second layer L2 may be disposed on the first layer L1. The second layer L2 may include a material the same as or different from that of the first layer L1. Specifically, the second layer L2 may include a metal material having excellent conductivity. For example, the second layer L2 may include a metal layer including at least one of copper (Cu), aluminum (Al), chromium (Cr), nickel (Ni), silver (Ag), or molybdenum (Mo), gold (Au), titanium (Ti), and alloys thereof. Preferably, the second layer L2 may include copper. That is, the second layer L2 may be a copper layer.

The second layer L2 may be formed through the electroless plating. The second layer L2 may be disposed to have a thickness greater than that of the first layer L1. In detail, the second layer L2 may be disposed to have a thickness of 0.1 μm to 1 μm.

The third layer L2 may be disposed on the second layer L2. The third layer L3 may include the same material as the second layer L2. For example, both the second layer L2 and the third layer L3 may include copper. That is, the third layer L3 may be a copper layer. In the wiring patterns 210 and 220, the second layer L2 and the third layer L3 including the same material may be distinguished from each other by a difference in the texture of each layer.

The third layer L2 may be formed through electrolytic plating using the second layer L2 as a seed layer. That is, the second layer L2 may be a seed layer for electrolytic plating of the third layer L3, and the third layer L3 may be a plating layer formed through the electrolytic plating. The third layer L3 may be disposed to have a thickness greater than that of the first layer L1 and the second layer L2. In detail, the third layer L3 may be disposed to have a thickness of 20 μm to 50 μm.

The fourth layer L4 may be disposed on the third layer L3. In detail, the fourth layer L4 may be disposed in contact with side surfaces and upper surfaces of the third layer L3. In detail, the fourth layer L4 may be disposed while being spaced apart from the substrate 100 and in contact with the side surfaces and upper surfaces of the third layer L3. That is, the fourth layer L4 may be disposed to be spaced apart from the substrate 100.

Since the fourth layer L4 is disposed to be spaced apart from the substrate 100, when the fourth layer L4 is formed by the plating process, a height of the circuit pattern may be increased more than the width thereof. Accordingly, it is possible to form more wiring patterns in the same area by minimizing the increase in width while securing a role as a coil by increasing a height of the coil member, thereby reducing the overall width of the coil member.

The fourth layer L4 may include the same material as the second layer L2 and the third layer L3. For example, the second layer L2, the third layer L3, and the fourth layer L4 may all include copper. That is, the fourth layer L4 may be a copper layer.

The fourth layer L4 may be a plating layer formed through the electrolytic plating. In detail, after the third layer L3 is formed, the fourth layer L4 may be formed by applying a current again through the plating line. The fourth layer L4 may be formed through one or more plating processes, and a plurality of layers having different textures may be formed on the fourth layer L4 according to the number of plating processes.

The fourth layer L4 may be disposed to have a thickness smaller than that of the third layer L3. In detail, the fourth layer L4 may be disposed to have a thickness of 5 μm to 15 μm.

Meanwhile, the wiring patterns 210 and 220 may further include a fifth layer. In detail, the fifth layer may be disposed on the pad portions 212*a* and 212*b* of the wiring pattern. The fifth layer may be disposed on the fourth layer L4. The fifth layer may be disposed on the pad portion to facilitate adhesion when the coil member and a terminal of the printed circuit board are connected.

The fifth layer may include a material the same as or different from those of the second to fourth layers. In detail, the fifth layer may include tin (Sn). That is, the fifth layer may include a tin layer. Alternatively, the fifth layer may include both copper and tin. For example, a tin content may be increased while the fifth layer extends from the fourth layer L4 toward an upper surface of the fifth layer.

The fifth layer may have a thickness smaller than those of the second to fourth layers. In detail, the thickness of the fifth layer may be 0.3 μm to 0.8 μm.

Protective layers 510 and 520 may be disposed on the wiring patterns 210 and 220. The protective layers 510 and 520 may be disposed to surround the wiring patterns 210 and 220. Accordingly, it is possible to prevent oxidation of the wiring pattern by external moisture, air, and the like, and to prevent film removal of the wiring pattern.

The protective layers 510 and 520 may be disposed to partially expose the wiring pattern. In detail, the protective layers 510 and 520 may be disposed on the wiring portion 211 and may not be disposed on the pad portions 212a and 212b. That is, the protective layer may be disposed to expose the pad portions 212a and 212b. Accordingly, the wiring pattern disposed on the first surface 1S of the substrate 100, that is, a lower surface of the coil member, may be connected to the terminal of the printed circuit board of the camera module on which the coil member is disposed through the pad portions 212a and 212b.

The protective layers 510 and 520 may include a first protective layer 510 and a second protective layer 520. In detail, the protective layers 510 and 520 may include the first protective layer 510 disposed on the first surface 1S of the substrate 100 and the second protective layer 520 disposed on the second surface 2S of the substrate 100.

The first protective layer 510 and the second protective insect 520 may be disposed to have different thicknesses. For example, the first protective layer 510 may be disposed to have a thickness smaller than that of the second protective layer 520. That is, the first protective layer 510 disposed on one surface 1S of the substrate on which the pad portion of the wiring pattern is disposed may be disposed to have a thickness smaller than that of the second protective layer 520 in order to connect the pad portion and the terminal of the printed circuit board.

For example, the thickness of the protective layers 510 and 520 may be 10 μm to 40 μm, and the first protective layer 510 may be disposed to have a thickness smaller than that of the second protective layer 520 in the above range.

However, the embodiment is not limited thereto, the thickness of the first protective layer and the second protective layer may be formed to be the same as or similar by forming the thickness of the second protective layer 520 of the substrate to be small.

When the thickness of the protective layers 510 and 520 exceeds 40 μm, the thickness of the coil member may increase. When the thickness of the protective layers 510 and 520 is less than 10 μm, the reliability of the wiring pattern of the coil member may be deteriorated.

The protective layers 510 and 520 may include an insulating material. The protective layers 510 and 520 may include various materials that may be cured by heating after being applied to protect a surface of the wiring pattern.

The protective layers 510 and 520 may be a resist layer. For example, the protective layers 510 and 520 may be a solder resist layer including an organic polymer material. As an example, the protective layers 510 and 520 may include an epoxy acrylate-based resin. In detail, the protective layers 510 and 520 may include a resin, a curing agent, a photoinitiator, a pigment, a solvent, a filler, an additive, an acryl-based monomer, and the like. However, the embodiment is not limited thereto, and the protective layers 510 and 520 may be any one of a photo-solder resist layer, a cover-lay, and a polymer material.

FIG. 7 is a view showing a cross-sectional view taken along line C-C' of FIG. 4. That is, FIG. 7 is a view showing a cross-sectional view of the plating pattern of the coil member according to the embodiment.

Referring to FIG. 7, the first plating pattern 310 and the second plating pattern 320 may be included on the substrate 100. In detail, the first plating pattern 310 disposed on the first surface 1S of the substrate 100 and the second plating pattern 320 disposed on the second surface 2S of the substrate 100 may be included. FIG. 7 illustrates that the first plating pattern 310 and the second plating pattern 320 are overlapped in a thickness direction of the substrate 100, but the embodiment is not limited thereto, and the plating pattern 310 and the second plating pattern 320 may be disposed to be shifted from each other in the thickness direction of the substrate 100.

Alternatively, the embodiment is not limited thereto, and only one plating pattern among the first plating pattern 310 and the second plating pattern 320 may be disposed on the substrate 100.

The first plating pattern 310 and the second plating pattern 320 may include a plurality of layers. The first plating pattern 310 and the second plating pattern 320 may include a plurality of conductive layers. In more detail, the first plating pattern 310 and the second plating pattern 320 may include the first layer L1, the second layer L2, and the third layer L3 that are sequentially stacked.

That is, the first plating pattern 310 and the second plating pattern 320 may be disposed in a layer structure different from that of the wiring patterns 210 and 220 described above. In detail, the first plating pattern 310 and the second plating pattern 320 may not include the fourth layer L4 unlike the wiring patterns 210 and 220.

Alternatively, the embodiment is not limited thereto, and the first plating pattern 310 and the second plating pattern 320 may include the first layer L1 and the second layer L2 that are sequentially stacked.

In detail, the first plating pattern 310 and the second plating pattern 320 may not include the third layer L3 and the fourth layer L4 unlike the wiring patterns 210 and 220.

Since the first plating pattern 310 and the second plating pattern 320 do not include the fourth layer L4 unlike the wiring patterns 210 and 220, a thickness T1 of the first plating pattern 310 and a thickness T2 of the second plating pattern 320 may be smaller than thicknesses of the wiring patterns 210 and 220. In detail, the thickness T1 of the first plating pattern 310 and the thickness T2 of the second plating pattern 320 may be smaller than the thicknesses of the wiring patterns 210 and 220 by a thickness of the fourth layer L4.

In addition, since the first plating pattern 310 and the second plating pattern 320 do not include the fourth layer L4 unlike the wiring patterns 210 and 220, a width W1 of the first plating pattern 310 and a width W2 of the second plating pattern 320 may also be smaller than widths of the wiring patterns 210 and 220. In detail, since the fourth layer L4 disposed on side surfaces of the wiring patterns 210 and 220 is not disposed on side surfaces of the first plating pattern 310 and the second plating pattern 320, the width W1 of the first plating pattern 310 and the width W2 of the second plating pattern 320 may also be smaller than the widths of the wiring patterns 210 and 220 by a width of the fourth layer L4.

The coil member according to the embodiment may reduce the protrusion length of the plating pattern protruding from an end of the substrate by forming the plating pattern so as to have a relatively small thickness.

As described above, when cutting with a laser along the cutting line of the coil member region, an intensity or irradiation time of the laser may be greater than that of other regions in order to remove the plating pattern in a region where the plating pattern is disposed on the substrate.

Accordingly, while the plating pattern is removed, the substrate in a peripheral region where the plating pattern is disposed may be removed together. In this case, the degree to which the substrate is removed may increase in proportion to the intensity and irradiation time of the laser. Accordingly, as the thickness of the plating pattern increases, the intensity and irradiation time of the laser increase, and accordingly, an area from which the substrate is removed in the region where the plating pattern is disposed may be increased. That is, the degree to which the substrate is removed during the process of cutting the plating pattern may be proportional to the thickness of the plating pattern.

Accordingly, when the coil member is cut, the substrate in the peripheral region on which the plating pattern is disposed is removed together. After the coil member is cut, the plating pattern may be disposed to protrude from the end of the substrate. Accordingly, poor appearance and reliability of the coil member may occur due to corrosion of the protruding plating pattern, whereby defects may occur when the coil member is coupled to the printed circuit board.

Therefore, the coil member according to the embodiment reduces the thickness of the plating pattern, whereby the intensity of the laser and irradiation time of the laser is reduced when cutting the coil member, thereby solving the above problems. That is, in the coil member according to the embodiment, the thickness of the plating pattern may be formed smaller than that of other patterns. Accordingly, when the coil member is cut, it is possible to minimize removal of the substrate of the peripheral region of the plating pattern. Accordingly, it is possible to minimize the length in which the plating pattern of the coil member protrudes from the end of the substrate after cutting the coil member.

Meanwhile, protective layers 510 and 520 may be disposed on the plating patterns 310 and 320. The protective layers 510 and 520 may be disposed to surround the wiring patterns 210 and 220. Accordingly, it is possible to prevent oxidation of the plating pattern by external moisture, air, and the like. and to prevent film removal of the wiring pattern. In detail, the plating patterns 310 and 320 disposed on the substrate 100 may be protected from external moisture or the like by the protective layers 510 and 520.

The protective layers 510 and 520 may be partially disposed on the plating patterns 310 and 320. In detail, the protective layers 510 and 520 may be disposed on the plating patterns 310 and 320 supported by the substrate 100, and the protective layers 510 and 520 may not be disposed on the plating patterns 310 and 320 protruding from the end of the substrate 100. This will be described in more detail with reference to FIGS. 8 and 9.

FIGS. 8 and 9 are a view showing a cross-sectional view taken along line D-D' of FIG. 4. That is, FIGS. 8 and 9 are cross-sectional views of a region where the plating pattern and the wiring pattern of the coil member according to the embodiment are connected.

Referring to FIGS. 8 and 9, the plating patterns 310 and 320 may be disposed to be connected to the wiring patterns 210 and 220. In detail, the plating patterns 310 and 320 may be integrally formed with the wiring patterns 210 and 220. In detail, the first plating pattern 310 may be connected to the first wiring pattern 210 disposed at the outermost portion among the first wiring patterns, and the second plating pattern 320 may be connected to the second wiring pattern 220 disposed at the outermost portion among the second wiring patterns.

That is, the first plating pattern 310 and the first wiring pattern 210 may be integrally formed, and the second plating pattern 320 and the second wiring pattern 220 may be integrally formed.

As described above, the thickness T1 of the first plating pattern 310 may be smaller than a thickness T3 of the first wiring pattern 210, and the thickness T2 of the second plating pattern 320 may be smaller than a thickness T4 of the second wiring pattern 220.

The plating patterns 310 and 320 may include a first region 1A and a second region 2A depending on whether the protective layers 510 and 520 are disposed. In detail, the plating patterns 310 and 320 may include the first region 1A in which the protective layers 510 and 520 are disposed and the second region 2A in which the protective layers 510 and 520 are not disposed. The second region 2A may be a region where the plating pattern is disposed to protrude from ends of the protective layers 510 and 520.

In addition, a side surface of the substrate between the first plating pattern 310 and the second plating pattern 320 in the second region 2A, which is a region from which the plating patterns 310 and 320 protrude, may be formed in a convex shape. In detail, when the coil member is cut as shown in FIG. 9, in a side surface LE of the substrate between the second regions 2A, a region close to the plating pattern is removed more by the laser than a region far away, so that the side surface of the substrate between the second regions 2A may be formed in the convex shape after cutting the coil member.

FIG. 10 is a view showing a cross-sectional view taken along line E-E' of FIG. 4. Referring to FIG. 10, a dummy pattern may be disposed on the substrate 100. In detail, the first dummy pattern 410 and the second dummy pattern 420 may be disposed to overlap or not overlap each other in the thickness direction of the substrate 100.

The dummy patterns 410 and 420 may include a plurality of layers. In detail, the dummy patterns 410 and 420 may include a first layer L1, a second layer L2, a third layer L3, and a fourth layer L4 that are disposed to be sequentially stacked.

That is, the dummy patterns 410 and 420 may be disposed in the same layer structure as the wiring patterns 210 and 220 described above.

Accordingly, since the first plating pattern 310 and the second plating pattern 320 do not include the fourth layer L4 unlike the dummy patterns 410 and 420, the thickness T1 of the first plating pattern 310 and the thickness T2 of the second plating pattern 320 may be smaller than the thickness T5 of the dummy patterns 410 and 420. In detail, the thickness T1 of the first plating pattern 310 and the thickness T2 of the second plating pattern 320 may be smaller than the thicknesses of the dummy patterns 410 and 420 by the thickness of the fourth layer L4.

In addition, since the first plating pattern 310 and the second plating pattern 320 do not include the fourth layer L4 unlike the dummy patterns 410 and 420, the width W1 of the first plating pattern 310 and the width W2 of the second plating pattern 320 may be smaller than widths of the dummy patterns 410 and 420. In detail, since the fourth layer L4 disposed on side surfaces of the dummy patterns 410 and 420 is not disposed on the side surfaces of the first plating pattern 310 and the second plating pattern 320, the width W1 of the first plating pattern 310 and the width W2 of the second plating pattern 320 may be smaller than the widths of the wiring patterns 410 and 420 by the width of the fourth layer L4.

In the coil member according to the embodiment, when a plurality of coil members are formed on a large-area substrate and then cut, it is possible to minimize a length in which a residual plating pattern of the coil member generated in the cutting process protrudes from the substrate.

That is, the plating pattern of the coil member protrudes from the end of the substrate because the substrate of the peripheral region of the plating pattern is removed together due to the thickness of the plating pattern in the cutting process, so that it is possible to reduce the intensity and time of the laser used when cutting the plating pattern region during the cutting process by reducing the thickness of the plating pattern.

Accordingly, an area of the substrate removed together in the peripheral region of the plating pattern during the process of cutting the coil member is reduced, thereby reducing the protrusion length of the plating pattern on the coil member protruding from the substrate after the cutting process.

Accordingly, it is possible to improve an external design of the coil member, and it is possible to prevent the protruding plating pattern from being short-circuited with a pattern of the other member. In addition, it is possible to prevent the reliability of the coil member from being deteriorated due to corrosion of the protruding plating pattern.

FIGS. 11 to 13 are views for describing a masking process and a cutting process of the plating line formed in the manufacturing process of the coil member according to the embodiment.

FIG. 11 is a view showing one region of FIG. 1, and FIG. 12 is a cross-sectional view taken along line F-F' of FIG. 11. Referring to FIGS. 11 and 12, a masking may be formed on the plating lines PL on the substrate 100.

The plating line PL is a region that becomes the plating pattern after the unit coil member is cut.

In detail, a masking material 600 may be disposed on a plating line PL connected to the coil member region CA among the plating lines PL disposed on the substrate 100.

The masking material 600 may be disposed after forming the third layer L3 among the layers of the circuit pattern of the coil member and before forming the fourth layer L4. Alternatively, the masking material 600 may be disposed after forming the second layer L2 among the layers of the circuit pattern of the coil member and before forming the third layer L3. The masking material may include a material the same as or similar to that of the protective layer described above.

Accordingly, the masking material may be disposed on the plating lines PL before the fourth layer L4 is formed on the circuit pattern of the coil member. Subsequently, the fourth layer L4 may be formed on the circuit pattern of the coil member.

Referring to FIG. 12, since the masking material 600 is disposed on the plating line PL, the fourth layer L4 is not disposed on the plating line PL, but the fourth layer L4 may be disposed only on a wiring pattern 200 connected to the plating line.

Subsequently, referring to FIGS. 11 and 13, the coil member may be cut along the cutting line CL.

At this time, since the plating line PL of the cutting line CL does not include the third layer L3 and/or the fourth layer L4, the plating line PL may be disposed with a thickness smaller than a thickness of the wiring pattern of the coil member.

Accordingly, when the cutting line CL is cut by the laser, the intensity and irradiation time of the laser by the plating layer in the cutting line may be reduced. Accordingly, since the area from which the substrate is removed may be reduced in the peripheral region of the plating line PL, the length protruding from the substrate of the plating pattern formed by the remaining plating line after cutting the coil member may be minimized.

Hereinafter, a camera module including the coil member according to an embodiment will be described with reference to FIG. 14. FIG. 14 is a view showing a combined perspective view of the camera module according to the embodiment.

Referring to FIG. 14, a camera module 10 according to the embodiment includes a cover can 1100, a first mover 1200, a second mover 1300, a stator 1400, a base 1500, and an elastic unit 1600. In addition, although not shown in FIG. 14, the camera module 10 according to the embodiment may further include a printed circuit board, an IR filter, an image sensor, and the like.

The cover can 1100 accommodates the elastic unit 1600, the first mover 1200, the stator 1400, and the second mover 1300 and is mounted on the base 1500 to form an exterior of a lens driving motor. Specifically, an inner surface of the cover can 1100 is in close contact with some or all of side surfaces of the base 1500 to be mounted on the base 1500, and the cover can 1100 has a function of protecting internal components from external impacts and preventing penetration of external contaminants.

In addition, the cover can 1100 should also perform a function of protecting the lens driving motor or the components of the camera module from external radio wave interference generated by a mobile phone or the like. Therefore, the cover can 1100 is preferably formed of a metal material.

The cover can 1100 may be implemented as a yoke unit itself, which will be described below, or may be fixed by molding the yoke unit on the inside thereof. In addition, an opening 1110 through which a lens unit (not shown) is exposed may be formed on an upper surface of the cover can 1100, and an inner yoke (not shown) bent inside the cover can 1100 may be formed at a lower end portion of the upper surface of the cover can 1100. This inner yoke may be positioned in a concave portion 1213 formed in the bobbin 1210. In this case, the inner yoke may be disposed at a corner around the opening on an upper surface of the yoke portion or may be disposed on a side surface of the yoke portion, and the concave portion of the bobbin may be formed at a corresponding position.

In addition, the cover can 1100 may have a fastening piece 1120 formed so as to extend at least one on each surface of the lower end portion thereof, and it is possible to implement a more robust sealing function and fastening function of the lens driving motor by forming a fastening groove 1520 into which the fastening piece 1120 is inserted in the base 1500. In addition, the fastening piece and the fastening groove may not be separately present, and only one of the two may be formed.

Meanwhile, the first mover 1200 is disposed on a side surface of the lens unit in order to move the lens unit (not shown). The first mover 1200 includes the bobbin 1210 for fixing the lens unit and a first coil member 1220 provided on an outer circumferential surface of the bobbin 1210.

The lens unit (not shown) may be a lens barrel provided with one or more lenses (not shown), but the embodiment is not limited thereto, and any holder structure capable of supporting the lens may be included.

An inner circumferential surface of the bobbin 1210 is coupled to an outer circumferential surface of the lens unit to fix the lens unit. In addition, the bobbin 1210 may have a guide part 1211, which guides the winding or mounting of the first coil member 1220, on an outer circumferential surface thereof. The guide part 1211 may be integrally formed with an outer surface of the bobbin 1210, and may be formed continuously along the outer surface of the bobbin 1210 or may be formed to be spaced apart at predetermined intervals.

In addition, a spring fastening protrusion 1212, to which an upper spring 1710 or a lower spring 1720 provided on the upper side of the base 1500 to support the bobbin 1210 is fastened, may be formed on the upper and lower surfaces of the bobbin 1210.

In addition, the bobbin 1210 may further include a concave portion 1213 formed on the outer circumferential surface thereof so that the inner yoke of the cover can 1100 may be positioned between the bobbin 1210 and the first coil member 1220 wound around the bobbin 1210.

In addition, the first coil member 1220 may be guided by the guide part 1211 and wound on the outer surface of the bobbin 1210, but four individual coils may be formed on the outer surface of the bobbin 1210 at 90° intervals. The first coil member 1220 may receive power applied from a printed circuit board (not shown) to be described later to form an electromagnetic field.

Meanwhile, the second mover 1300 may be positioned to face the first mover 1200 on a side surface of the first mover 1200 and may include a magnet part 1310 disposed so as to face the first coil member 1220 and a housing 1320 to which the magnet part 1310 is fixed.

Specifically, the magnet part 1310 may be mounted to the housing 1320 by an adhesive or the like so as to be disposed at a position corresponding to an outer surface of the first coil member 1220 and may be mounted on four corners inside the housing 1320 at equivalent intervals to promote efficient use of the internal volume.

The housing 1320 may be formed in a shape corresponding to an inner surface of the cover can 1100 forming the exterior of the lens driving motor. In addition, the housing 1320 may be formed of an insulating material and may be made as an injection molding product in consideration of productivity. The housing 1320 may be a moving part for OIS driving and may be disposed to be spaced apart from the cover can 1100 by a certain distance.

In the embodiment, the housing 1320 may be formed in a hexahedral shape to be spaced apart by a predetermined distance corresponding to a shape of the cover can 1100, and upper and lower sides of the housing 1320 may be opened to support the first mover 1200. In addition, the housing 1320 may include a magnet part fastening hole 1311 or a magnet part fastening groove formed in a shape corresponding to the magnet part 1310 on a side surface thereof.

In addition, at least two stoppers 1312 that are formed to protrude at a predetermined distance from an upper surface of the housing 1320 to be in contact with the upper surface of the cover can 1100 to enable to absorb an external impact may be formed. The stopper 1312 may be formed integrally with the housing 1320.

In addition, a spring fastening protrusion 1313 to which the upper spring 1710 or the lower spring 1720 provided on the upper side of the base 1500 to be described later so as to support the housing 1320 is fastened may be formed on the upper and lower surfaces of the housing 1320.

Meanwhile, the stator 1400 is positioned so as to face a lower side of the second mover 1300 in order to move the second mover 1300 and has through-holes 1411 and 1421 corresponding to the lens unit that are formed in a center thereof.

Specifically, the stator 1400 may include a second coil member 1410 positioned so as to face a lower side of the magnet part 1310 and a substrate on which the second coil member 1410 is disposed on the upper side to apply power, and an OIS chip is mounted, and the substrate may be a printed circuit board 1420. That is, the second coil member 1410 may be the coil member described above with reference to FIGS. 1 to 13.

The second coil member 1410 may be mounted on the printed circuit board 1420 provided on the upper side of the base 1500 or formed on a flexible printed circuit board or a substrate, and the through-hole 1411 is formed in the center in order to pass a light signal of the lens unit (not shown). Meanwhile, when considering the miniaturization of the lens driving motor, specifically, lowering the height in a z-axis direction, which is an optical axis direction, the second coil member 1410 may be formed as a fine pattern (FP) coil that is a patterned coil and disposed on the flexible printed circuit board.

The flexible printed circuit board 1420 may be provided on an upper surface of the base 1500 to apply power to the second coil member 1410, and the through-hole 1421 corresponding to the through-hole 1411 of the second coil member 1410 is formed on the flexible printed circuit board 1420. In addition, the printed circuit board 1420 may include a terminal portion 1422 having one end or both ends facing each other bent to protrude to the lower side of the base 1500 and may be supplied with external power through the terminal portion 1422.

In addition, the embodiment may further include a hall sensor unit (not shown) mounted on a lower or upper surface of the printed circuit board 1420 so as to correspond to a position of the magnet part 1310.

The hall sensor unit senses an intensity and phase of a voltage applied to detect the movement of the magnet part 310 and a current flowing through the coil and interacts with the printed circuit board 1420 to be provided in order to precisely control the actuator.

The hall sensor unit may be provided on a straight line with respect to the magnet part 1310 and the optical axis direction, and since the hall sensor unit has to detect displacements in the x-axis and y-axis, the hall sensor unit may include two hall sensors respectively provided at adjacent two corners among corners of the printed circuit board 1420. A hall sensor receiving groove 1540 capable of accommodating the hall sensor may be formed in the base 1500. In addition, the hall sensor may be provided with one or more.

Although the hall sensor unit is provided closer to the second coil member 1410 than the magnet part 1310, considering that the strength of the magnetic field formed in the magnet part is several hundred times greater than the strength of the electromagnetic field formed in the coil, the influence of the second coil member 1410 in detecting the movement of the magnet part 1310 is not considered.

The lens unit is moved in all directions by the independent or organic interaction of the first mover 1200, the second mover 1300, and the stator 1400, so that the image focus of a subject is focused through the interaction of the first mover 1200 and the second mover 1300, and a camera shake and the like may be corrected by the interaction of the second mover 1300 and the stator 1400.

Meanwhile, the base 1500 supports the stator 1400 and the second mover 1300, and a hollow hole 1510 corresponding to the through-holes 1411 and 1421 is formed in a center thereof.

The base 1500 may function as a sensor holder to protect an image sensor (not shown) and may be provided to position an IR filter (not shown) at the same time. In this case, the IR filter may be mounted in the hollow hole 1510 formed in the center of the base 1500, and an infrared ray

19

(IR) filter may be provided. In addition, the IR filter may be formed of, for example, a film material or a glass material, and an infrared blocking coating material may be disposed on a plate-shaped optical filter such as a cover glass for protecting an imaging surface, a cover glass, or the like. In addition, a separate sensor holder may be positioned under the base in addition to the base.

In addition, the base 1500 may be formed with one or more fixing protrusions 1530 protruding from an upper corner to face or couple to the inner surface of the cover can 1100, and such a fixing protrusion 1530 may easily guide fastening of the cover can 1100 and may achieve firm fixation after fastening. In addition, two or more fixing protrusions may be formed.

In addition, the base 1500 may have the fastening groove 1520 into which the fastening piece 1120 of the cover can 1100 is inserted. The fastening groove 520 may be formed locally on an outer surface of the base 1500 in a shape corresponding to a length of the fastening piece 1120 or may be formed entirely on the outer surface of the base 1500 so that a predetermined part of the lower end portion of the cover can 1100 including the fastening piece 1120 is inserted.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present disclosure.

In addition, embodiments are mostly described above, but the embodiments are merely examples and do not limit the present disclosure, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present disclosure defined in the following claims.

The invention claimed is:

1. A coil member comprising:
a substrate including a first surface and a second surface opposite to the first surface;
a wiring pattern disposed on the substrate; and
a plating pattern connected to the wiring pattern,
wherein a thickness of the plating pattern is smaller than a thickness of the wiring pattern,
wherein the plating pattern is disposed protruding from an end of the substrate,
wherein a protruding length of the plating pattern is smaller than a first distance between the end of the substrate and an outermost wiring pattern among the wiring patterns.

2. The coil member of claim 1, wherein the protrusion length of the plating pattern is 30 μm or less.

3. The coil member of claim 1, wherein a layer structure of the plating pattern is different from that of the wiring pattern.

4. The coil member of claim 1, wherein the wiring pattern is formed by sequentially stacking a first layer, a second layer, a third layer, and a fourth layer,
wherein the plating pattern is formed by sequentially stacking the first layer and the second layer.

5. The coil member of claim 1, wherein the wiring pattern is formed by sequentially stacking a first layer, a second layer, a third layer, and a fourth layer, and
the plating pattern is formed by sequentially stacking the first layer, the second layer, and the third layer.

6. The coil member of claim 5, wherein the first layer includes at least one layer of a nickel layer, a chromium layer, and a titanium layer,
wherein the second layer to the fourth layer include at least one metal of copper, aluminum, chromium, nickel, silver, molybdenum, gold, titanium, and alloys thereof.

7. The coil member of claim 5, wherein a thickness of the plating pattern is smaller than a thickness of the wiring pattern by a thickness of the fourth layer.

8. The coil member of claim 7, wherein the thickness of the fourth layer is 5 μm to 15 μm.

9. The coil member of claim 1, wherein the protrusion length of the plating pattern is greater than at least one of a width and an interval of the wiring pattern.

10. The coil member of claim 1, wherein a width of the plating pattern is smaller than a width of the wiring pattern.

11. The coil member of claim 1, further comprising a dummy pattern disposed on at least one of the first surface and the second surface,
wherein the thickness of the plating pattern is smaller than a thickness of the dummy pattern.

12. The coil member of claim 11, wherein a layer structure of the dummy pattern is the same as that of the wiring pattern.

13. The coil member of claim 11, wherein a width of the plating pattern is smaller than a width of the dummy pattern.

14. The coil member of claim 13, wherein the second region is a region where the plating pattern protrudes.

15. The coil member of claim 1, wherein the plating pattern includes a first region on which the passivation layer is disposed and a second region on which the passivation layer is not disposed.

16. The coil member of claim 1, wherein a side surface of the substrate is formed in a convex shape.

17. The coil member of claim 1, wherein the wiring pattern includes a first wiring pattern disposed on the first surface and a second wiring pattern disposed on the second surface,
a first protective layer disposed on the first surface and a second protective layer disposed on the second surface are further included, and
a thickness of the first protective layer and a thickness of the second protective layer are different.

18. The coil member of claim 17, wherein the first wiring pattern includes a wiring portion and a pad portion, and
the thickness of the first protective layer is smaller than the thickness of the second protective layer.

19. The coil member of claim 18, wherein a thickness of the first protective layer and the second protective layer is 10 μm to 40 μm.

20. A camera module comprising:
a first mover disposed on a side surface of a lens unit to move the lens unit;
a second mover positioned so as to face the first mover on a side surface of the first mover;
a stator positioned so as to face a lower side of the second mover to move the second mover and having a through-hole corresponding to the lens unit formed in a center thereof; and a base supporting the stator and the second mover and having a hollow hole corresponding to a through-hole of the second mover formed in a center thereof, wherein the stator includes a circuit board and a coil member disposed on the circuit board, wherein the coil member includes:

a substrate including a first surface and a second surface opposite to the first surface;

a wiring pattern disposed on the substrate; and a plating pattern connected to the wiring pattern, wherein a thickness of the plating pattern is smaller than a thickness of the wiring pattern, wherein the plating pattern is disposed protruding from an end of the substrate, wherein a protruding length of the plating pattern is smaller than a first distance between the end of the substrate and an outermost wiring pattern among the wiring patterns.

\* \* \* \* \*